(12) United States Patent
Okumura et al.

(10) Patent No.: US 7,193,221 B2
(45) Date of Patent: Mar. 20, 2007

(54) ELECTRONIC OPTICAL LENS BARREL AND PRODUCTION METHOD THEREFOR

(75) Inventors: Katsuya Okumura, Tokyo (JP); Motosuke Miyoshi, Tokyo (JP)

(73) Assignee: Toudai TLO, Ltd., Tokyo (JP)

( * ) Notice: Subject to any disclaimer, the term of this patent is extended or adjusted under 35 U.S.C. 154(b) by 127 days.

(21) Appl. No.: 10/516,827

(22) PCT Filed: Jun. 10, 2003

(86) PCT No.: PCT/JP03/07331

§ 371 (c)(1),
(2), (4) Date: Dec. 3, 2004

(87) PCT Pub. No.: WO03/107383

PCT Pub. Date: Dec. 24, 2003

(65) Prior Publication Data

US 2005/0173649 A1    Aug. 11, 2005

(30) Foreign Application Priority Data

Jun. 13, 2002   (JP)  ............................. 2002-173174

(51) Int. Cl.
*H01J 3/26*   (2006.01)
*H01J 3/14*   (2006.01)
*G21K 1/08*   (2006.01)

(52) U.S. Cl. ............................. 250/396 R; 250/492.3; 313/361.1

(58) Field of Classification Search .................... None
See application file for complete search history.

(56) References Cited

U.S. PATENT DOCUMENTS

| | | | | |
|---|---|---|---|---|
| 5,719,402 A | * | 2/1998 | Satoh et al. | 250/396 R |
| 5,929,452 A | * | 7/1999 | Yoshitake et al. | 250/396 R |
| 6,055,718 A | * | 5/2000 | Ooaeh et al. | 29/592.1 |
| 6,125,522 A | * | 10/2000 | Nakasuji | 29/458 |
| 6,509,568 B1 | * | 1/2003 | Ooae et al. | 250/396 R |

FOREIGN PATENT DOCUMENTS

| | | |
|---|---|---|
| JP | 60-236443 | 11/1985 |
| JP | 63-54241 | 12/1988 |
| JP | 05-190129 | 7/1993 |
| JP | 06-187901 | 7/1994 |
| JP | 10-268096 | 10/1998 |
| JP | 2000-106117 | 4/2000 |

* cited by examiner

*Primary Examiner*—Nikita Wells

(57) ABSTRACT

The present invention provides an electron optical lens column suitable for miniaturization, and provides the manufacturing method thereof. The column unit (1) comprises an inner column (11) and an outer column (12). The column unit is, as a whole, structured from a high-resistance electrically conductive ceramic. Electrostatic lenses (21, 22, 23, and 24) are affixed to the inner surface (111) of the inner column using a means such as plating or vapor deposition. Of the electrodes or electrode parts (211–213, 221, 231, 232, and 241–243) from which the lens is structured, those that share the same electric potential are connected by shared interconnections. This makes it possible to connect all of the electrodes or electrode parts with shared electric potentials as a group to the external interconnections.

25 Claims, 14 Drawing Sheets

ELECTRONIC OPTICAL LENS BARREL AND PRODUCTION METHOD THEREFOR

TECHNICAL FIELD

The present invention relates to electron optical lens columns and to manufacturing methods thereof.

BACKGROUND OF THE INVENTION

Electron optical lens columns are used in order to produce lens effects on electron beams such as in scanning electron microscopes (SEMs) and ion beam (EB) equipment. An example of a lens column used in an SEM is described as an "electrostatic lens" in Japanese Unexamined Patent Application Publication H 6-187901.

However, recently there have been demands for high precision and tighter focusing of electron beams for the purposes of, for example, microlithography processes. Increasing the degree of focus requires high acceleration of the electrons through applying a high voltage. However, this engenders problems in terms of bulky and expensive equipment. Furthermore, high velocity electrons engender the following problems:

(a) Because the electron beam penetrates the surface of the sample, it is no longer suitable for observing the surface.
(b) There will be deleterious effects, such as the sample being destroyed by the electron beam.
(c) With biological samples, the material is nonconductive, and thus electrostatic charge tends to build up. Charged material has an impact on the electric field, adversely affecting the precision of the focus of the electron beam.

However, if it were possible to obtain a compact, high-precision lens column, it would then be possible to shorten the distance between the electrode and the electron beam, making it possible to subject the electron beam to large electric fields even if the acceleration voltage on the electrons is low, and, in turn, making it possible to focus the beam with high precision.

Unfortunately, the electrostatic lenses used in electron optical lens columns require high precision in their placement and dimensions. When lens columns have been made smaller, there has been a tendency for there to be increased error in the positioning and dimensions of the electrostatic lenses, which may lead to reductions in focusing precision.

DISCLOSURE OF THE INVENTION

The present invention is the result of consideration of the factors described above. The object of the present invention is to provide an electron optical lens column, and a manufacturing method thereof, suitable to miniaturization.

The electron optical lens column according to the present invention comprises electrostatic lenses arrayed on the inner surface of the column unit. The inner surface of said column unit has high-resistance electrical conductivity.

The inner surface of said column unit, in said electron optical lens column, may be structured from a ceramic material that has high-resistance electrical conductivity.

The aforementioned column unit may be structured from essentially a single material.

Said single material may be a ceramic material that has high-resistance electrical conductivity.

The aforementioned high-resistance electrical conductivity refers to a state where, for example, the resistivity is in the range of $10^8$ to $10^{10}$ $\Omega$-cm.

Said column unit may comprise an inner column and an outer column. Said inner column may be disposed within said outer column.

The electrostatic lens may be provided with, on the inner surface of said column unit, with electrodes for producing an electric field. Interconnections for applying voltages to said electrodes may be connected to said electrodes. Said interconnections may be provided between said inner column and said outer column.

A plurality of said electrodes may be provided. Said interconnections may connect together those electrodes having identical electric potentials.

Said interconnections may be structured so as to mutually connect, via resistances or switching elements, those said electrodes having differing electric potentials.

Said electrostatic lenses may be equipped, on the inner surface of said column unit, with electrodes for generating electric fields. Said electrodes may be attached to the inner surface of said column unit.

For electrodes equipped in multiple electrostatic lenses, multiple electrode parts, mutually separate from each other, may be provided. The number of electrode parts in each of said electrodes may be identical.

Multiple electrostatic lenses may be provided with electrodes, said electrodes may be provided with multiple electrode parts that are mutually separate from each other, and those of said electrode parts that are of identical electrical potentials may be structured so as to be mutually connected electrically by interconnections.

The electron optical lens column of the present invention may be structured so that said column unit comprises an inner column and an outer column, where said inner column is disposed within said outer column, multiple electrostatic lenses are each provided, on the inside of said column units, with electrodes for producing electric fields, said electrodes are equipped on the inner surface of said column unit, said electrodes are equipped with multiple electrode parts that are separate from each other, those of said electrode parts having identical electric potentials are mutually connected, electrically, via interconnections, and said interconnections are disposed between said inner column and said outer column.

Conversely, the electron optical lens column of the present invention may be structured so that the aforementioned column unit has an inner column and an outer column, the aforementioned inner column is disposed inside of the aforementioned outer column and contains a plurality of the aforementioned electrostatic lenses, each of said electrostatic lenses is equipped with electrodes for generating electric fields inside of the aforementioned column unit, the aforementioned electrodes are disposed on the inner surface of the aforementioned column unit, the aforementioned electrodes are equipped with a plurality of electrode parts that are mutually separate from each other, the aforementioned electrode parts are connected to each other via interconnections and resistances in order to apply differing voltages to these electrode parts, and the aforementioned interconnections and resistances are disposed between the aforementioned inner column and the aforementioned outer column.

Conversely, the electron optical lens column of the present invention may be structured so that the aforementioned column unit has an inner column and an outer column, the aforementioned inner column is disposed inside of the aforementioned outer column and contains a plurality of the aforementioned electrostatic lenses, each of said electrostatic lenses is equipped with electrodes for generating electric fields inside of the aforementioned column unit, the aforementioned electrodes are disposed on the inner surface of the aforementioned column unit, the aforementioned electrodes are equipped with a plurality of electrode parts that are mutually separate from each other, the aforementioned electrode parts are connected to each other via interconnections and switching elements in order to apply differing voltages to these electrode parts, and the aforementioned interconnections and switching elements are disposed between the aforementioned inner column and the aforementioned outer column.

The aforementioned electron optical lens column may be structured so as to form a plurality of said electrostatic lenses and grooves are formed between the aforementioned electrostatic lenses.

The aforementioned electron optical lens column may be structured so that the electrostatic lenses are equipped with a plurality of electrodes and grooves are formed between the aforementioned electrodes.

The aforementioned electron optical lens column may be structured so that the aforementioned electrostatic lenses are equipped with a plurality of electrodes, said electrodes are each equipped with a plurality of electrode parts, and grooves are formed between said electrode parts.

The aforementioned electron optical lens column may be structured so that an electron gun chamber is equipped at one end of the aforementioned column unit.

The aforementioned electron optical lens column may be structured so that a secondary electron detector is equipped at the other end of said column.

The aforementioned electron optical lens column may be equipped with a flange for attaching the electron gun chamber, integrated with the column unit, at one end of the column unit.

The aforementioned electron optical lens column may be equipped with a column part, which forms a side wall of an electron gun chamber, on one end of the aforementioned column unit, and integrated with the aforementioned column unit.

The scanning electron microscope of the present invention is equipped with a lens column as described above.

The ion beam device of the present invention is equipped with a lens column as described above.

The manufacturing method for the electron optical lens column of the present invention has the following steps:
(1) A step that coats an electrically conductive material on the inner surface of a column unit, and
(2) A step that obtains one set of electrodes for structuring an electrostatic lens through the removal of a portion of the aforementioned electrically conductive material that has been coated.

Conversely, the manufacturing method for the electron optical lens column may have "a step that obtains one set of electrodes for forming the lens through coating an electrically conductive material in a specific pattern on the inner surface of the column unit."

Conversely, the manufacturing method for the electron optical lens column according to the present invention may have the following steps:
(1) A step that coats an electrically conductive material on the inner surface of a column unit,
(2) A step that obtains multiple electrodes for structuring one or more electrostatic lenses through the removal of a portion of the aforementioned electrically conductive material that has been coated, and
(3) A step that connects, via interconnections, those aforementioned multiple electrodes that have identical electric potentials.

Conversely, the manufacturing method for the electron optical lens column according to the present invention may have the following steps:
(1) A step that coats an electrically conductive material on the inner surface of a column unit,
(2) A step that obtains multiple electrode parts for structuring electrodes for electrostatic lenses through removing a portion of the aforementioned electrically conductive material that has been coated, and
(3) A step that connects, via interconnections, those aforementioned multiple electrode parts that have identical electric potentials.

Conversely, the manufacturing method for the electron optical lens column according to the present invention may have the following steps:
(1) A step that arranges interconnections on the outer surface of a column unit,
(2) A step that forms, in an inner column, either before or after the aforementioned step (1), through holes for connecting the aforementioned interconnections with electrodes that are disposed on the inner surface of said inner column,
(3) A step that fits an outer column onto the outside of said inner column,
(4) A step that forms, in said outer column, either before or after the aforementioned step (3), through holes for connecting the aforementioned interconnections with outside circuitry on the aforementioned outer column.

BEST MODE FOR CARRYING OUT THE INVENTION

Figure 1:
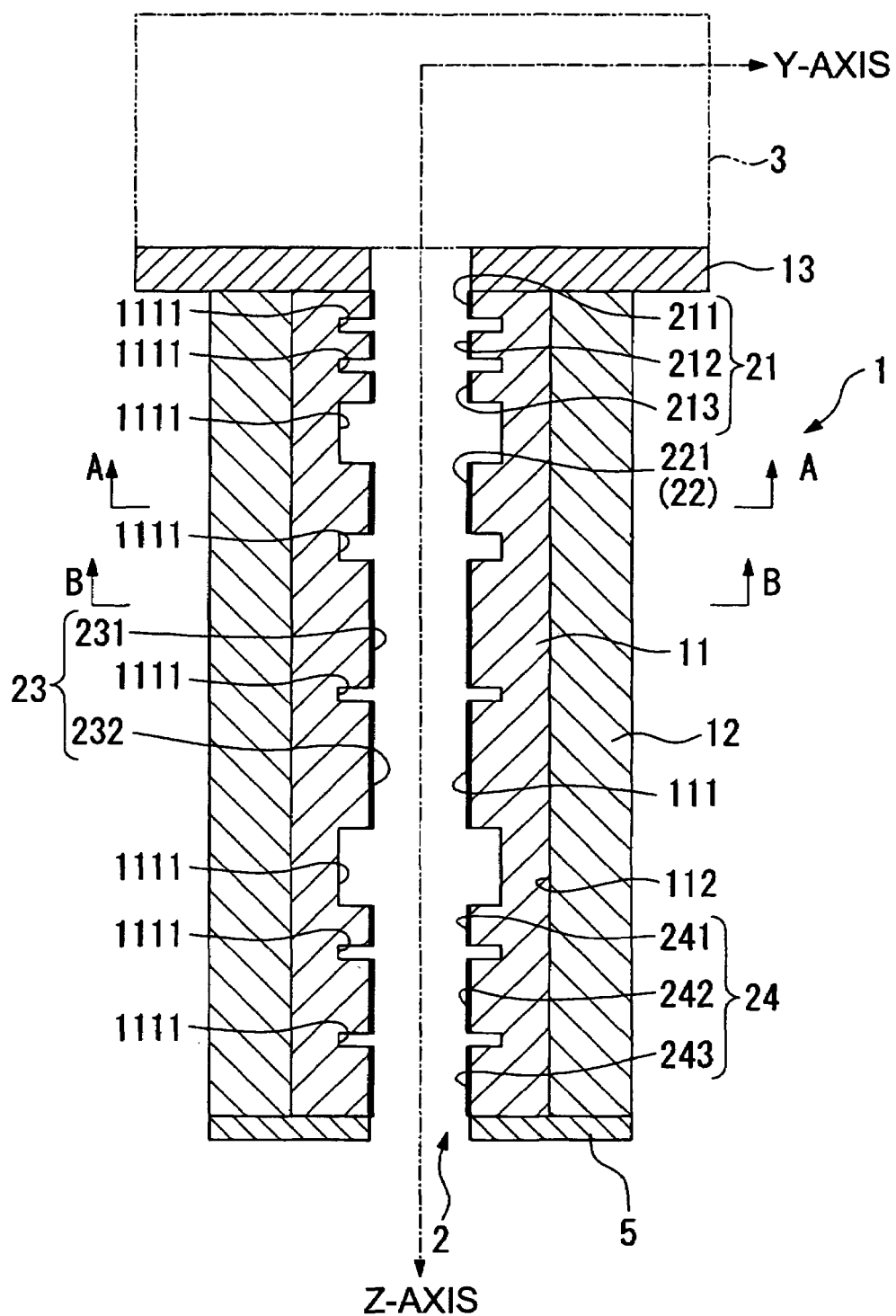
FIG. 1 is an explanatory diagram, where descriptions of the interconnections have been omitted, in a lengthwise cross section of a lens column according to a first example embodiment of the present invention.

An electron optical lens column according to a first example of the present invention will be explained below, based on FIGS. 1 through 12. The lens column according to this example embodiment is provided with a column unit 1, an electrostatic lens (sometimes abbreviated as simply "lens" in this description) 2, disposed on the inner surface of this column unit 1, an electron gun chamber 3, interconnections 4, and a secondary electron detector 5. (See FIGS. 1 through 7.)

The column unit 1 is equipped with an inner column 11, and outer column 12, and a flange 13. (See FIG. 1.) A high-resistance electrically conductive ceramic is used as the material for all of these in this example embodiment. Furthermore, in this example embodiment, the resistivity of the high-resistance electrically conductive ceramic is in the range of $10^8$ to $10^{10}$ Ω-cm. More preferably, the resistivity should be in the range of about $10^8$ to $10^9$ Ω-cm. Resistivities that are too high will prevent the electric charge from leaking, which will tend to cause charge buildup. Conversely, resistivities that are too low will cause there to be a large leakage current between electrodes. This resistivity, preferably, is set so as to produce electric charge leakage to a degree that can effectively prevent charge buildup. In the range described above, the resistivity is preferably set to a high value to prevent the leakage current.

Ceramic compositions that can be used in the present example embodiment include, for example, a mixture of 10 to 20% of $TiO_2$ in a base ingredient of $Al_2O_3$, or a mixture of about 30% $Fe_2O_3$ and 4% $Y_2O_3$ in a base ingredient of $ZrO_2$. Conversely, a mixture of about 0.2% to 1% of B, $Al_2O_3$ and/or $Y_2O_3$ into SiC as the base material may also be used. The ceramic in the present example embodiment preferably has a relatively high resistivity (about $10^9$ Ω-cm), and, preferably, has a density that is near to that of the pure material. From this perspective, either pure $Al_2O_3$ or a mixture of 15% of $TiO_2$ into $Al_2O_3$, with characteristics near thereto, is preferred. Given the structure, the inner surface of the column unit 1 (or in other words, the inner surface 111 of the inner column 11) is structured from a high-resistance electrically conductive ceramic. Furthermore, given the structure described above, the column unit 1 is structured from, essentially, a single material (that is to say, the high-resistance electrically conductive ceramic). The inner column 11 and the outer column 12 can typically be obtained through, firing after molding ceramic powder at high-pressure.

The inner column 11 is cylindrical. Through holes 113, which connect between the inner surface 111 and the outer surface 112, are formed in the inner column 11. (See FIG. 7.) Interconnections 114, which are connected to electrodes (described below) attached to the inner surface 111, and which extend to the outer surface 112, are disposed inside the through holes 113.

The outer column 12 is a cylindrical shape that fits on the outside of the inner column 11. More specifically, the inner diameter of the outer column 12 is slightly smaller than the outer diameter of the inner column 11, so that the outer column 12 can be fitted onto the inner column 11 through a heated fitting process or through a chilled fitting process. As with the inner column 11, through holes connecting the inner surface 121 and the outer surface 122, are formed in the outer column 12. (See FIG. 7.) Interconnections 124, which are connected to the interconnections 114 of the inner column 11, or connected to interconnections 4, which are disposed on the outer surface of the inner column 11, which extends to the outer surface 122 of the outer column 12, is disposed on the inside of the through holes 123.

An electrostatic lens 2 is equipped with a gun lens 21, an astigmatism corrector 22, an XY deflector 23, and an object lens 24. (See FIG. 1.) The lens effect of the lens 2 is shown schematically in FIG. 3. The gun lens 21 is of a triode type, equipped with electrodes 211, 212, and 213. (See FIG. 1.) When a single lens is structured from multiple electrodes, these multiple electrodes shall be referred to as "1 set of the electrodes." Each of these electrodes 211 to 213 is shaped as a thin ring. The thickness of each of the electrodes 211 to 213 is, for example, 2 to 5 microns. The widths of each of the electrodes 211 to 213 can be, for example, between 3 and 6 mm. These widths are generally determined by the electron optics characteristics required in the lens, and determined in consideration of ease of manufacturing. Grooves 1111, which extend in the peripheral direction of the inner column 11, are formed between these electrodes 211 to 213. The electrodes 211 to 213 are separated from each other by these grooves 1111. The electrodes 211 and 213, on each side, are connected to zero volts (ground). Note that in the specification "connected to ground" is also termed "having a voltage applied." The structure is such that an appropriate voltage (that is, a voltage that is capable of generating the required electric field) is applied to the center electrode 212. (The interconnections will be described below.)

Figure 4:
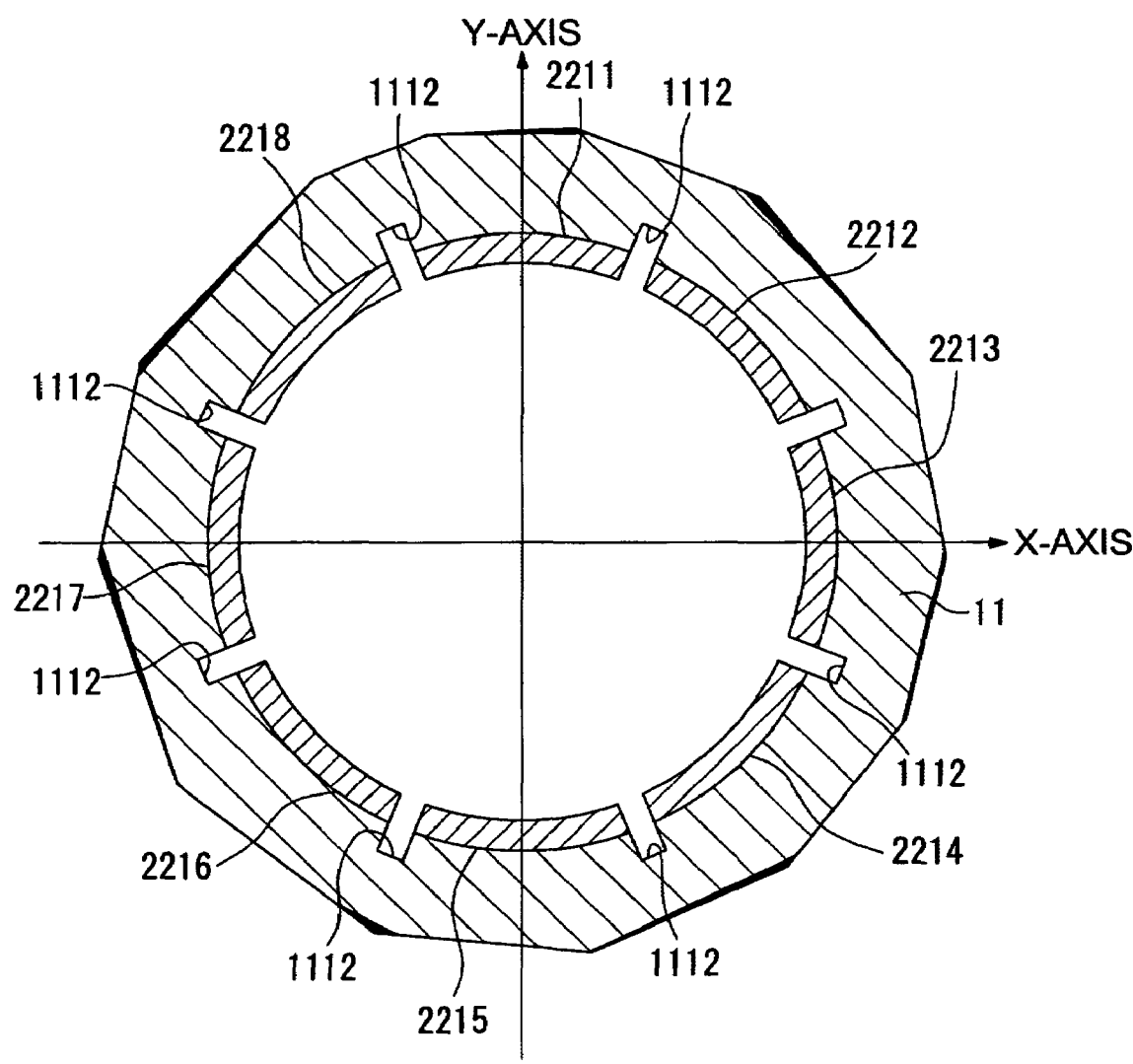
FIG. 4 is a magnified view of the critical parts in FIG. 2.

The astigmatism corrector 22 is provided with one electrode 221. The electrode 221 is equipped with eight electrode parts 2211 through 2218, arranged in the peripheral direction on the inner column 11. FIG. 4 shows the arrangement of electrode parts 2211 through 2218. Grooves 1112, extending in the axial direction of the inner column 11, are formed between the electrode parts 2211 through 2218. The electrode 221 is divided into the electrode parts 2211 through 2218 by the grooves 1112. The voltages described below are applied to the various electrode parts 2211 through 2218 via interconnections (described below). Note that "0 V" means that the applicable electrode is connected to the ground.

Electrode parts 2211 and 2215: Vy (V),

Electrode parts 2212, 2213, 2216 and 2217: 0 (V), and

Electrode parts 2214 and 2218: Vx (V).

Here the index letters "x" and "y" indicate two mutually orthogonal directions. The voltage Vy indicates the voltage V required for eliminating that part of the astigmatism that occurs in the y direction. The voltage Vx indicates the voltage V required for eliminating that part of the astigmatism that occurs in the x direction, perpendicular to the y direction.

Figure 2:
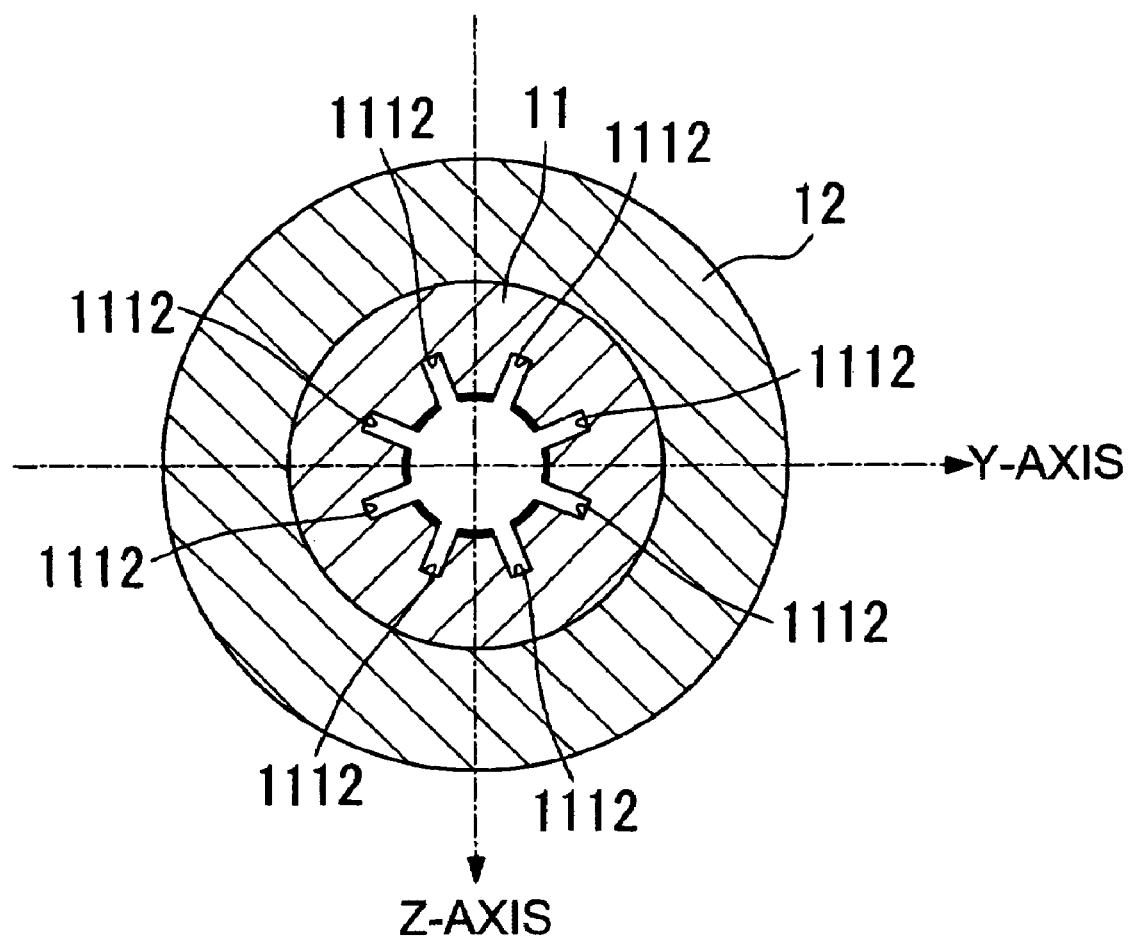
FIG. 2 is a schematic cross-sectional diagram along the line A—A in FIG. 1.
Figure 3:
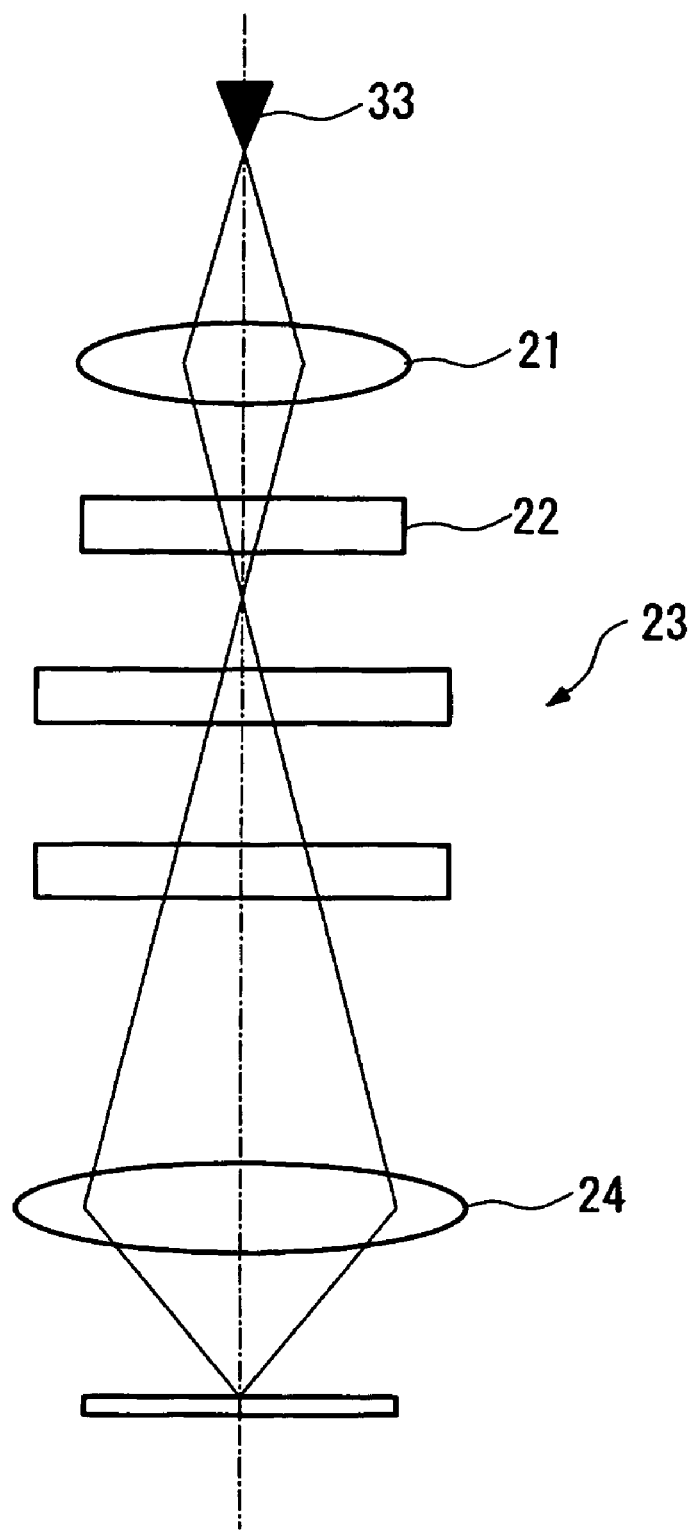
FIG. 3 is an explanatory diagram for explaining the lens effect in the lens column of FIG. 1.
Figure 5:
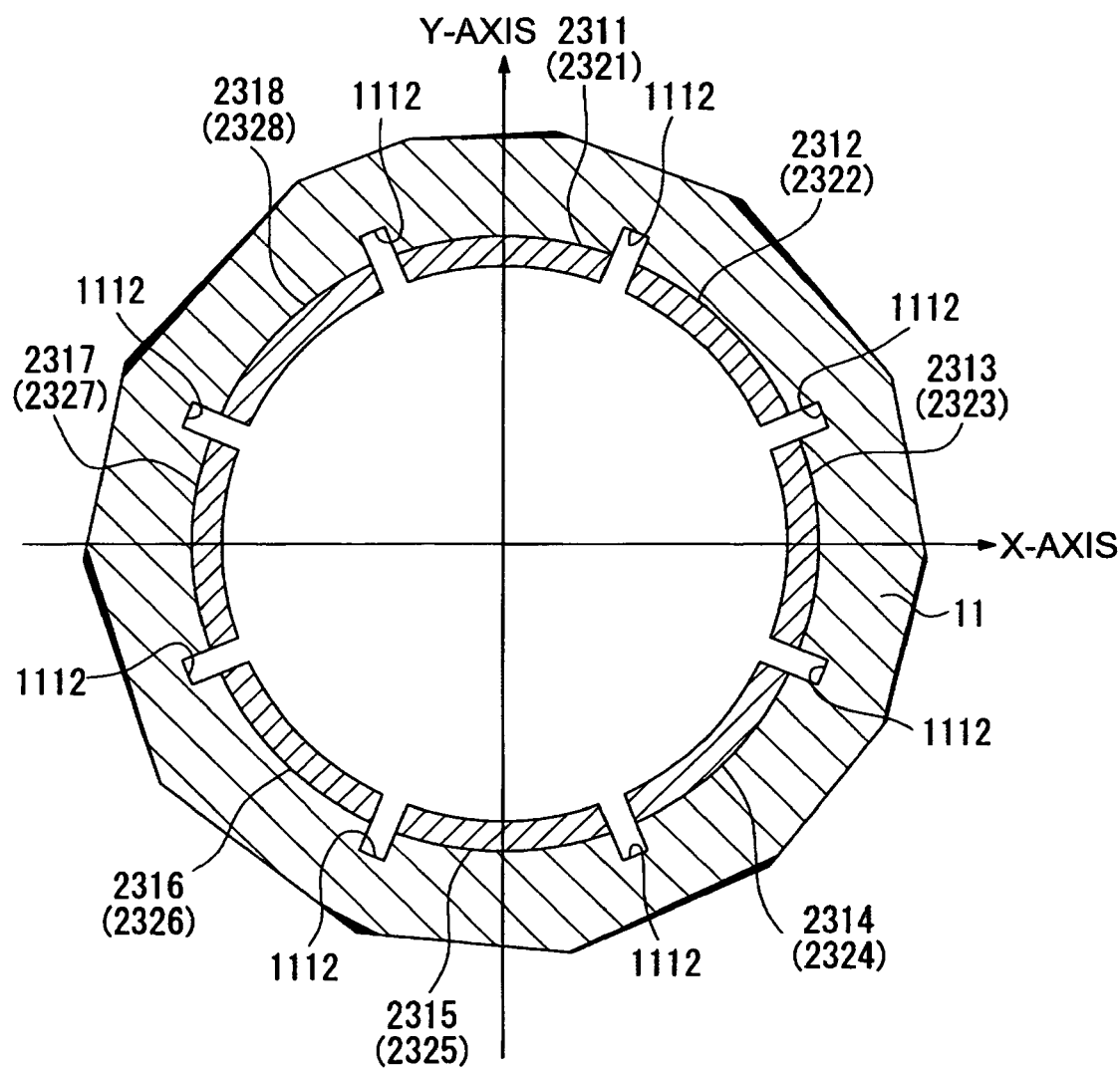
FIG. 5 is a schematic cross-sectional diagram of critical parts along the line B—B in FIG. 1.
Figure 6:
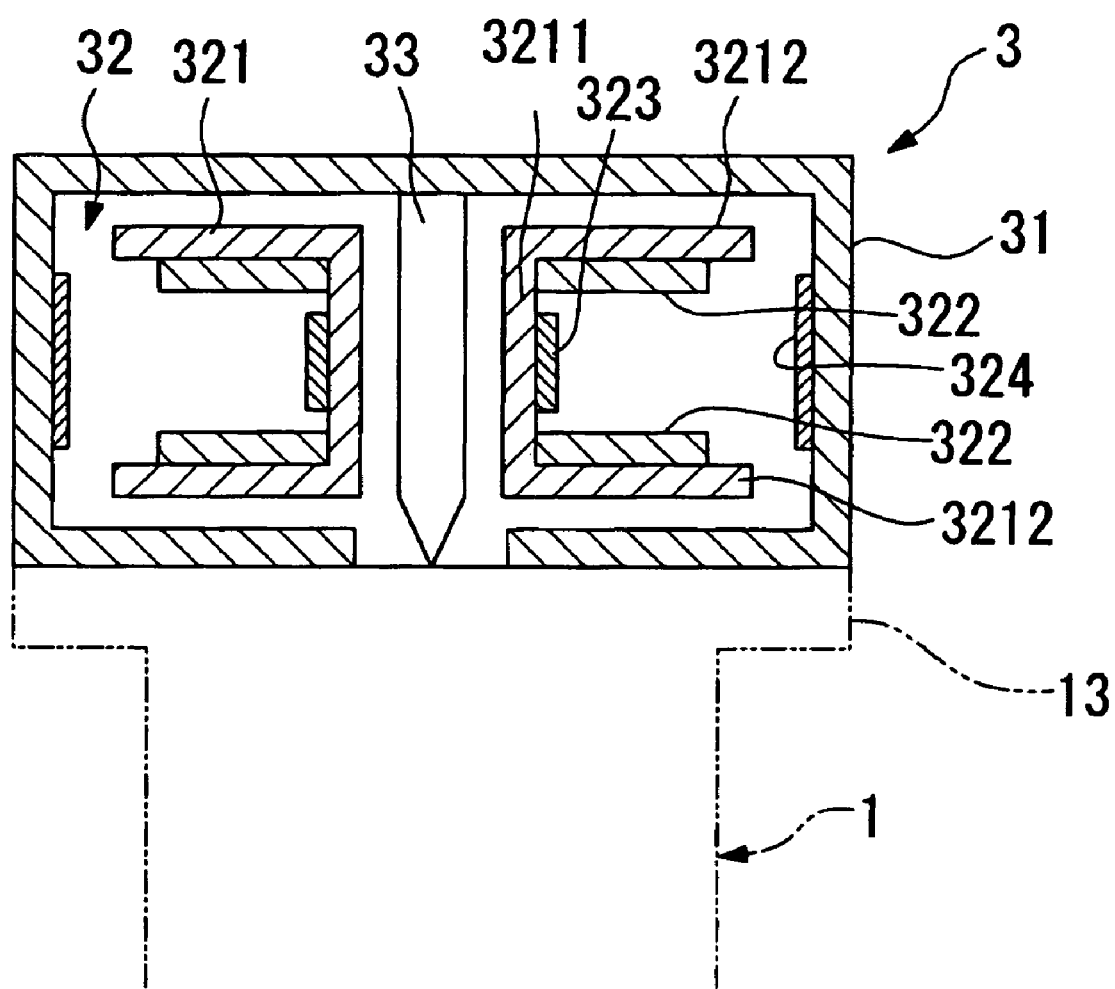
FIG. 6 is a lengthwise cross-sectional diagram of an electron gun chamber used in the lens column of FIG. 1.

The multiple electrode parts that share identical electric potentials are connected to each other via interconnections 4, as explained below. The XY deflector 23 is equipped with 2 electrodes 231 and 232, which extend in the peripheral direction. (See FIG. 1.) The electrodes 231 and 232 are separated from each other by a groove 1111, extending in the peripheral direction, lying therebetween. These electrodes 231 and 232 are each equipped with eight electrode parts, 2311 through 2318 and 2321 through 2328, respectively. FIG. 2 and FIG. 5 show the layouts of these electrode parts. As with the astigmatism corrector 22, grooves 1112, extending in the axial direction, are formed between each of the electrode parts. The various voltages listed below are applied via interconnections (described below) to the respective electrode parts 2311 through 2318 and 2321 through 2328:

Electrode parts 2311, 2312, 2321 and 2322: Vy (V),
Electrode parts 2313, 2318, 2323 and 2328: $b_0$ Vy (V),
Electrode parts 2314, 2317, 2324, and 2327: $-b_0$ Vy (V), and
Electrode parts 2315, 2316, 2325, and 2326: −Vy (V).

In the above, $b_0$ equals $2^{0.5}-1$.

The multiple electrode parts that share identical electric potentials are connected to each other via interconnections 4, as described below, here as well.

As with the gun lens 21, the object lens 24 is also a triode-type, equipped with electrodes 241, 242, and 243. (See FIG. 1.) The various electrodes 241 to 243 are shaped as thin rings. The electrodes 241 and 243, on both sides, are connected to 0 V (ground). The structure is such that an appropriate voltage (that is, the voltage that is able to produce the required electric field) is applied to the center electrode 212. (The interconnections will be described below.) The other structure in the object lens 24 is the same as in the gun lens 21.

The electron gun chamber 3 is equipped with a vacuum chamber 31, an ion pump 32, and an electron gun cathode 33. (See FIG. 6.) The vacuum chamber 31 is attached to a flange 13 of the column unit 1. The electron gun cathode 33 is disposed in a position that is coaxial with the column unit 1. The base part of the electron gun cathode 33 is attached to the inner surface of the vacuum chamber 31. The tip part of the electron gun cathode 33 is disposed facing the column unit 1.

The ion pump 32 is equipped with a yoke 321, permanent magnets 322, a cathode 323, and an anode 324. The yoke 321 has a cylindrical body 3211, and two flanges 3212, integrated with said body 3211, on either side thereof. The permanent magnets 322 are equipped on the opposite surfaces of the two flange parts 3212. The cathode 323 is disposed on the side surface (outer peripheral surface) of the body 3211. The anode 324 is the inner surface of the vacuum chamber 31, and is disposed facing the cathode 323. The cathode 323 and the anode 324 can be formed through, for example, plating or vapor deposition.

Figure 7:
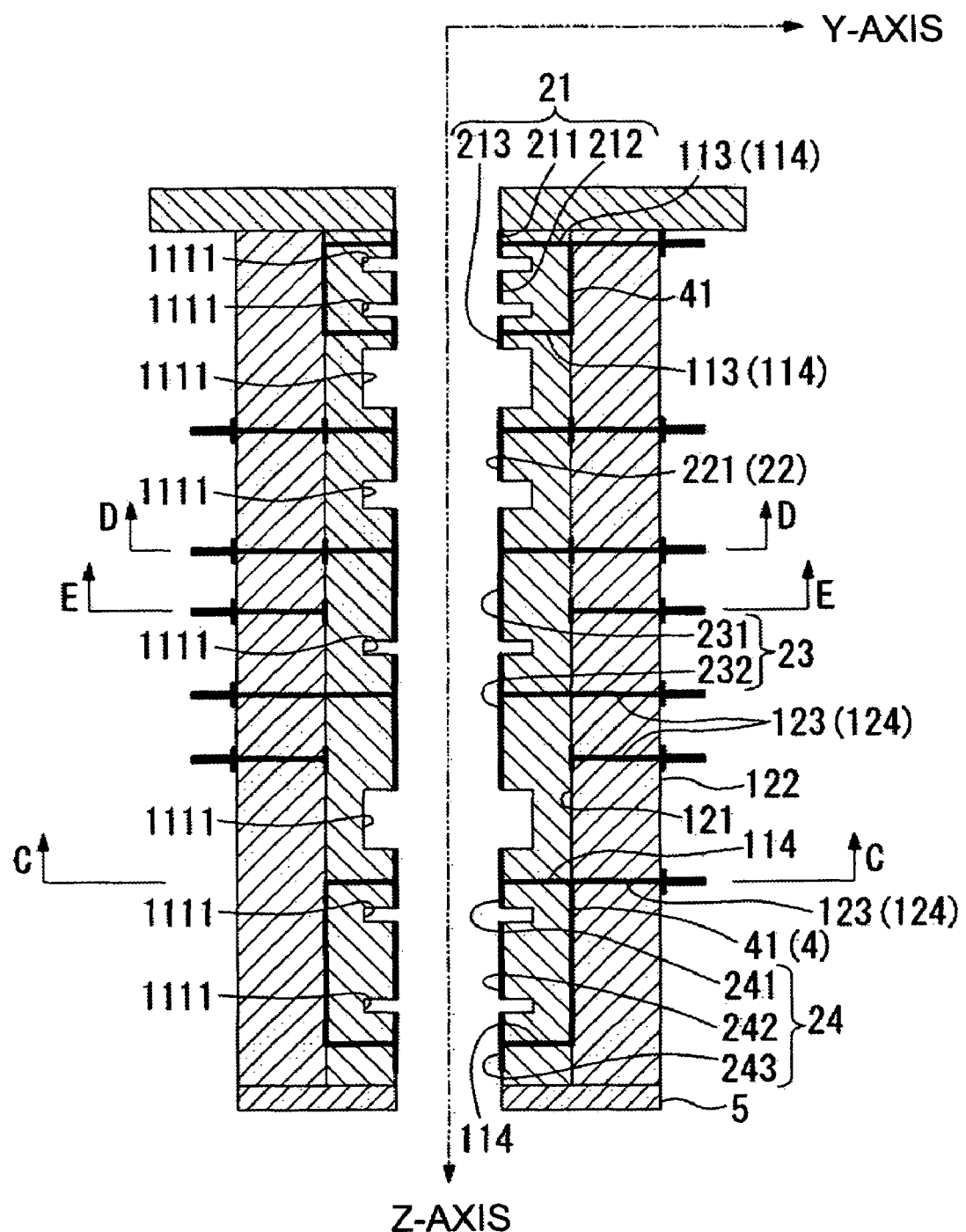
FIG. 7 is an explanatory diagram where a description of the interconnections has been added in the lens column of FIG. 1.
Figure 8:
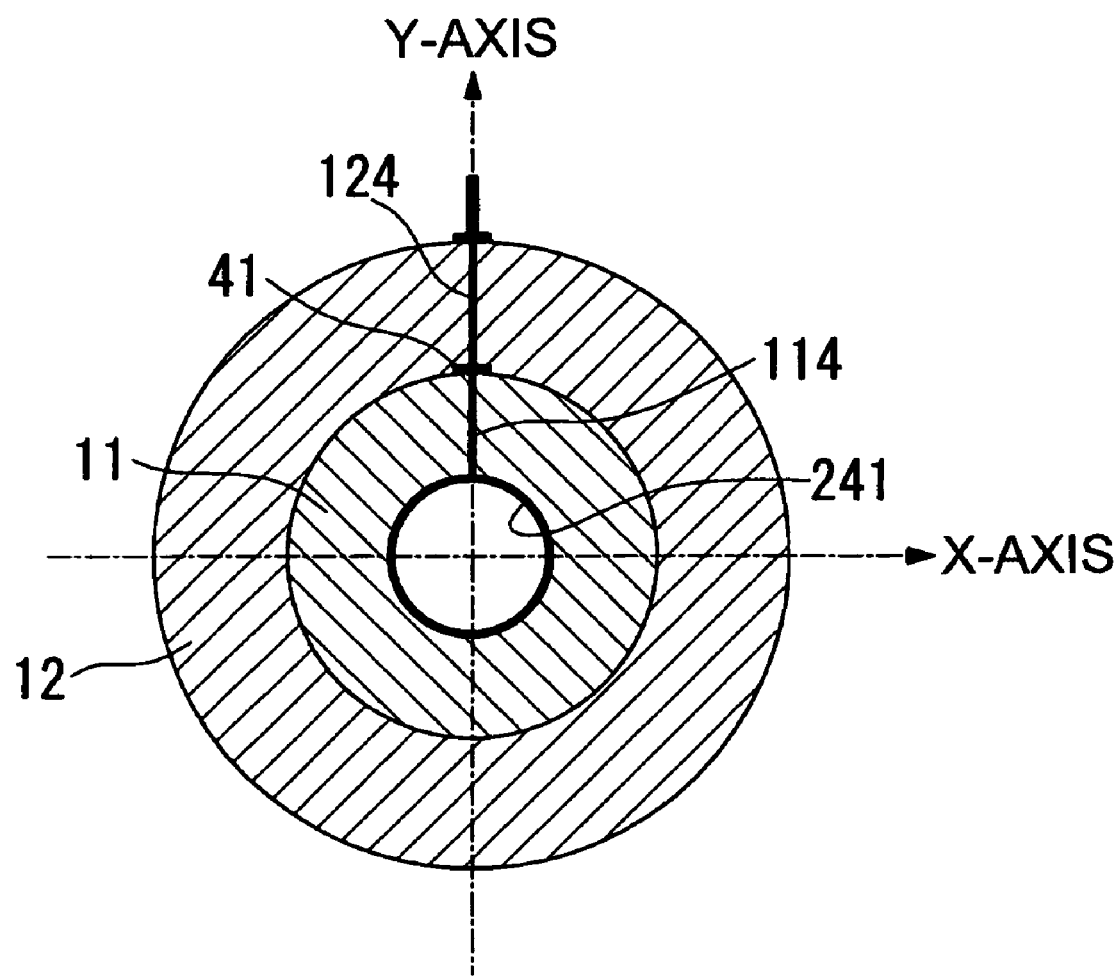
FIG. 8 is a cross-sectional diagram along the line C—C in FIG. 7.

The interconnections 4 are disposed between the inner column 11 and the outer column 12. In the present example embodiment, the interconnections 4 connect the interconnections 114 of the inner column 11, which are connected to those electrodes or electrode parts that share identical electric potentials, with the interconnections 124 of the outer column 12. (See FIG. 7.) The interconnections 4 include interconnections 41, which extend in the axial direction of the column unit 1, and interconnections 42, which extend in the peripheral direction of the column unit 1. (See FIG. 9.) The interconnections 41, as shown in FIG. 7, are disposed in the two locations described below. For reference, FIG. 8 shows a cross-sectional diagram along the line C—C of FIG. 7.

(1) The positions that connect together the interconnections 114, which are connected to the electrodes 211 and 213 that comprise the gun lens 21, and (2) The positions that connect together the interconnections 114, which are connected to the electrodes 241 and 243 that comprise the object lens 24.

Figure 9:
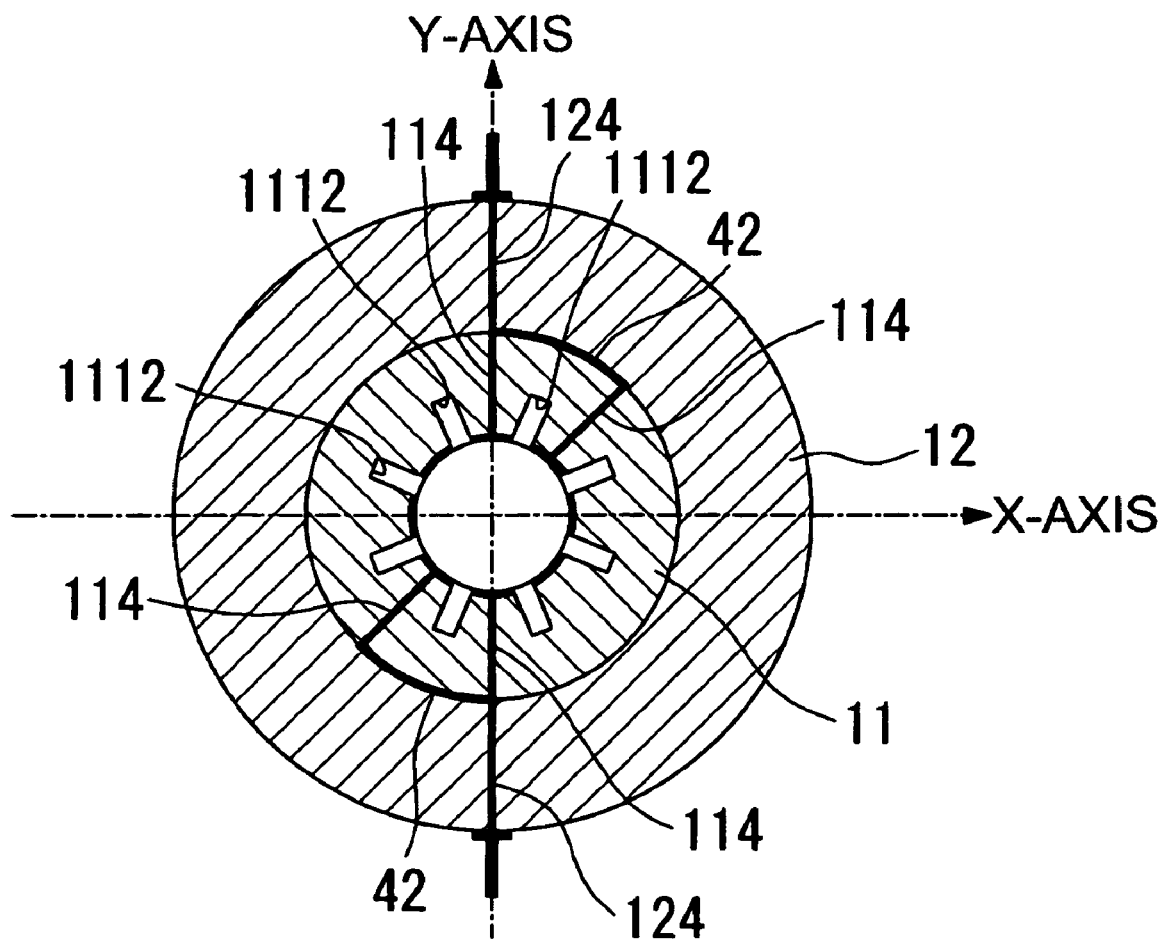
FIG. 9 is a cross-sectional diagram along the line D—D in FIG. 7.
Figure 10:
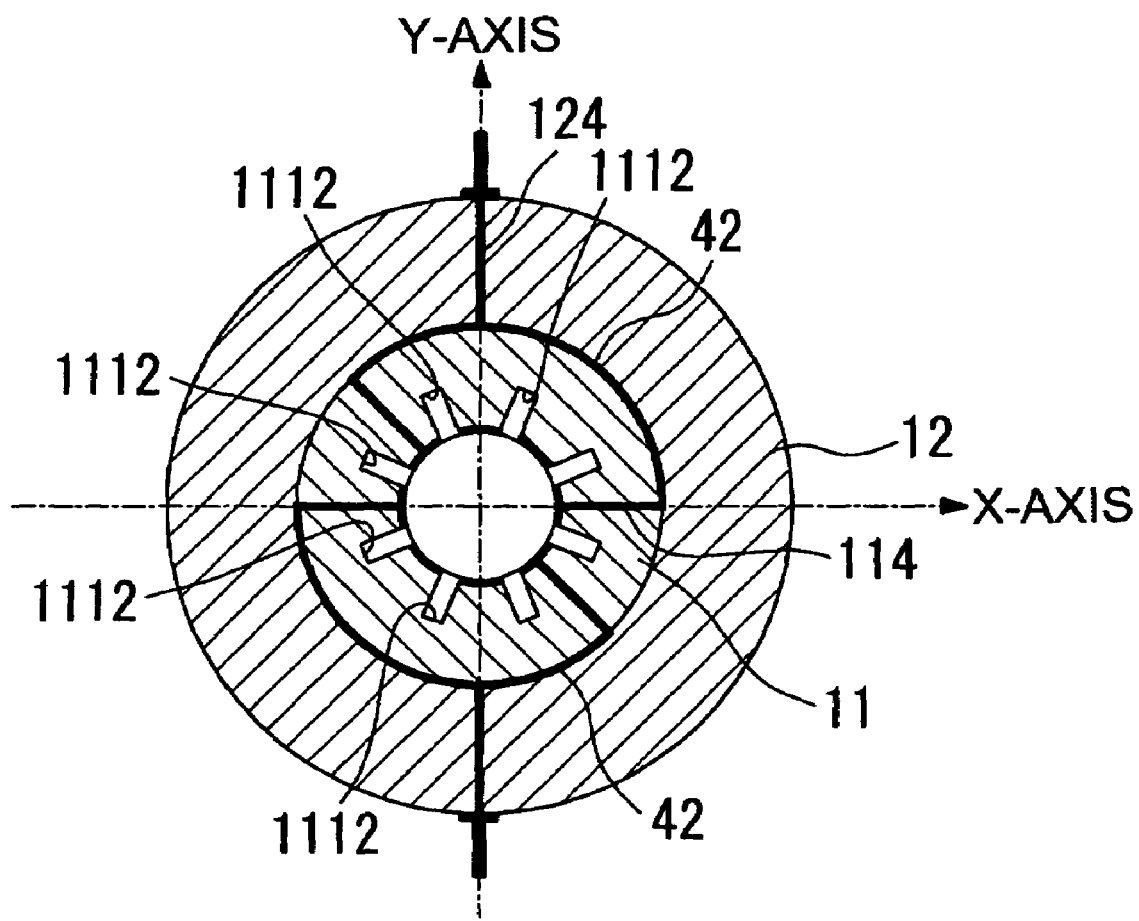
FIG. 10 is a cross-sectional diagram along the line E—E in FIG. 7.
Figure 11A:
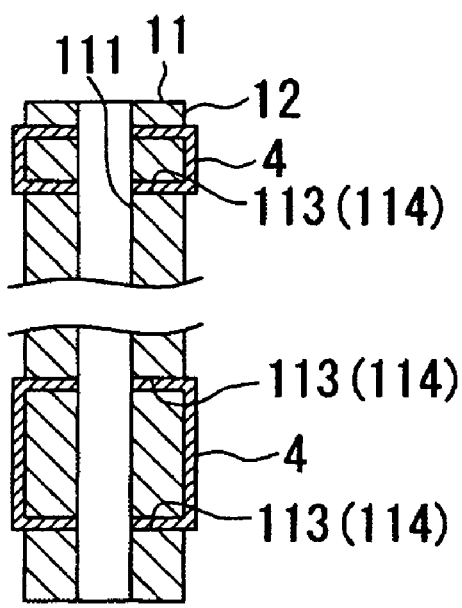
FIG. 11A through FIG. 11D are explanatory diagrams for explaining the manufacturing method for the lens column of FIG. 1.
Figure 11B:
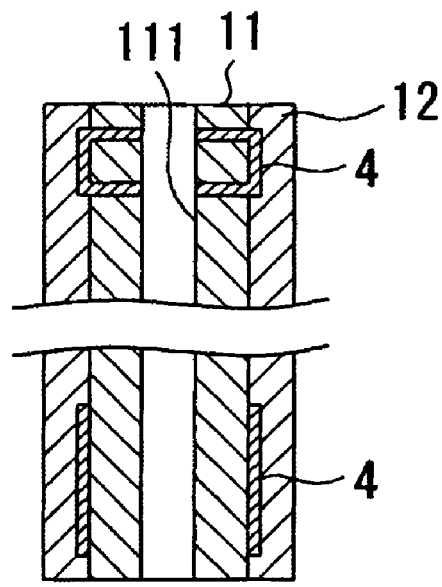
Figure 11C:
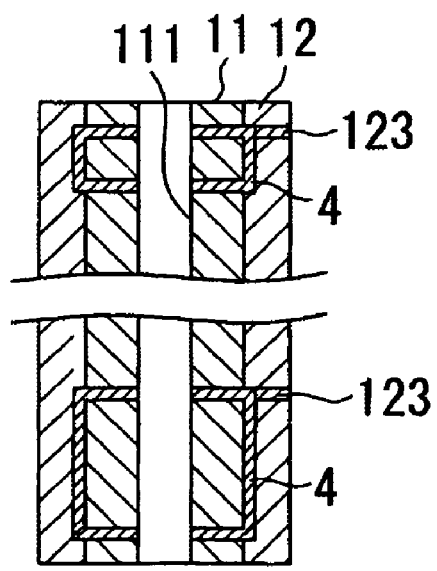
Figure 11D:
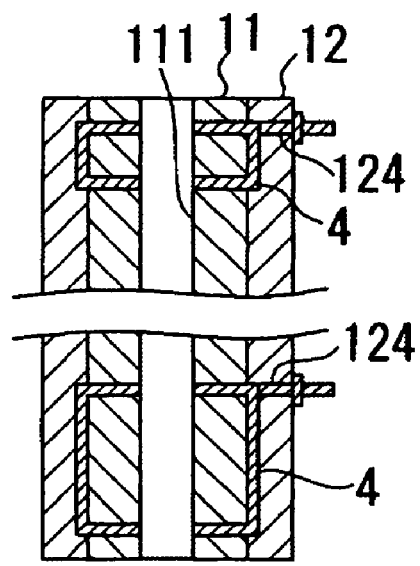
Figure 12A:
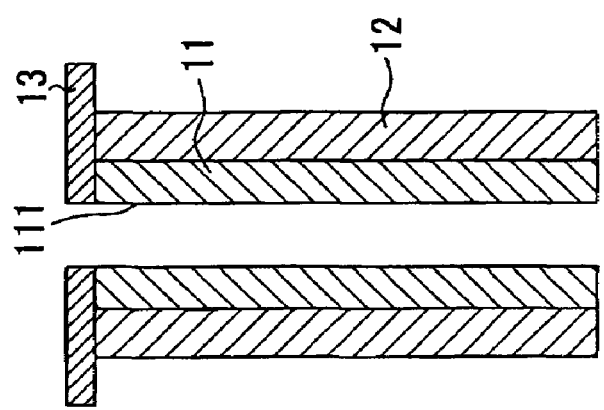
FIG. 12A through FIG. 12F are explanatory diagrams for explaining the manufacturing method for the lens column of FIG. 1.
Figure 12B:
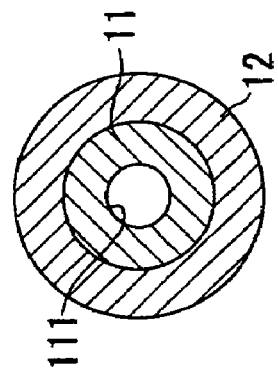
Figure 12C:
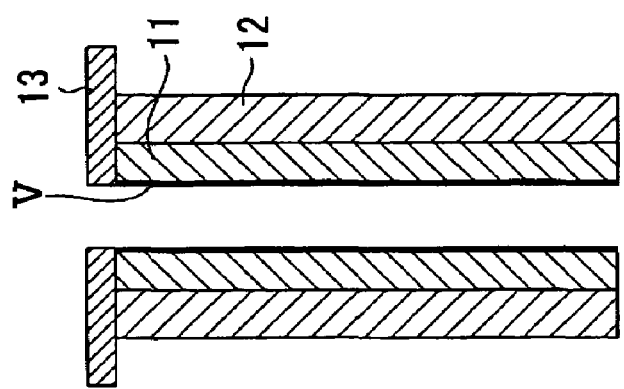
Figure 12D:
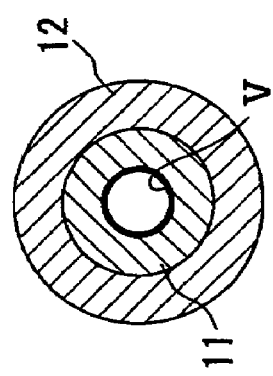
Figure 12E:
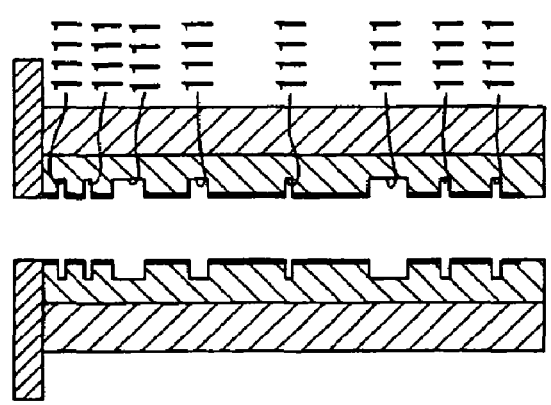
Figure 12F:
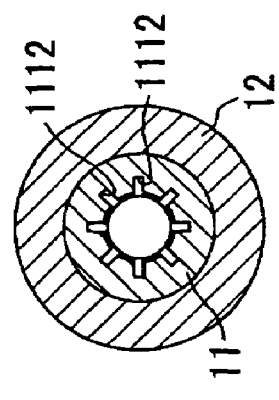

The interconnections 42 that extend in the peripheral direction of the column unit 1 are disposed in the following locations:

(1) As shown in FIG. 9 and FIG. 10, the positions wherein the electrode parts 2311 through 2318 in the electrode 231 of the XY deflector 23 that share identical electric potentials are connected to each other, (2) As with the aforementioned (1), the positions wherein the electrode parts 2321 through 2328 of the electrode 232 that share identical electric potentials are connected to each other (not shown), and (3) As with the aforementioned (1) and (2), the positions wherein the electrode parts 2211 through 2218 of the astigmatism corrector 22 that share identical electric potentials are connected to each other.

The secondary electron detector 5 is attached to the end of the column unit 1. (See FIG. 1 and FIG. 7.) The structure of the secondary electron detector 5 is the same as that which is conventionally known, so detailed explanations will be omitted.

The method of manufacturing the lens column in the present example embodiment will be explained next, based on FIG. 11 and FIG. 12. First, an appropriate method, such as firing, is used to obtain the inner column 11 and the outer column 12. After this, preferably, the inner surface 111 of the inner column 11 is polished to increase the dimensional precision. After this, the through holes 113, which penetrate in the inward-outward direction, are formed on the side surfaces of the inner column 11. After this, the insides of the through holes 113 are filled with electrically conductive materials, such as solder. This produces the interconnections 114 in the inner column 11. Following this, the interconnections 4 are formed on the outer surface 112 of the inner column 11. (FIG. 11 A) The interconnections 4 can be formed using any appropriate method, such as plating or vapor deposition.

Following this, the outer column 12 is fitted onto the outside of the inner column 11, using a heated fitting process or a chilled fitting process. (FIG. 11 B) Following this, through holes 123, which pass through the outer column 12 in the inward-outward direction, are formed in the side surface of the outer column 12. (FIG. 11 C) Following this, as with a case for the through holes 113, the through holes 123 are filled with an electrically conductive material. (FIG. 11 D) This makes it possible to obtain the interconnections 124 in the outer column 12. The locations of the various aforementioned through holes and interconnections are determined in advance. Following this, the flange 13 is attached to the ends of the inner column 11 and the outer column 12, thus producing the column unit 1. (FIG. 12 A and FIG. 12 B) Note that FIG. 12 omits the descriptions of the interconnections and through holes shown in FIG. 11. Following this, a means, such as plating or vapor deposition, is used to form a metal coating V on the inner surface of the inner column 11. (FIGS. 12 C and D) After the metal coating V has been formed, a polishing process is performed in order to increase the surface precision. Following this, the grooves 1111 and 1112, which partition the respective lenses and electrodes, are formed. (FIGS. 12 E and F) The method of fabricating these grooves 1111 and 1112 may use, for example, etching in photolithography. Of course, the grooves may instead be formed using mechanical machining. The fabrication of the grooves in this way partitions the metal coating V to produce the electrodes or electrode parts.

The operation of the lens column of the present invention will be explained next. First the operation of the electron gun chamber 3 will be explained. (See FIG. 6.) In the electron gun chamber 3, a high voltage is applied in the cathode 323 and the anode 324. The electrons that are extracted from the cathode in this way are caused, by the effects of the magnetic field generated by the permanent magnets 322, to move in a helical path, and said electrons collide with residual gas molecules. When this occurs, the residual gas molecules are ionized, and are adsorbed onto the cathode 323. Because this ion pump effect is well known, all further explanation will be omitted. The effect makes it possible to achieve a high vacuum within the ion pump 32.

Following this, the effect of the gun lens 21 extracts electrons from the electron gun cathode 33. The extracted electrons pass through the astigmatism corrector 22, the XY deflector 23, and the object lens 24, to arrive at the object. (See FIG. 3.)

Because, in the lens column according to the present example embodiment, the column unit 1, and in particular, the inner column 11, has a high-resistance electrical conductivity, it is possible to reduce the amount of charge buildup between the electrodes (where said charge buildup is the amount of charge that occurs through the scattered electrons accumulating on the surface of insulators that are exposed between the electrodes). If the resistivity on the inner surface of the column unit 1 is too high, then charge buildup will occur between the electrodes, causing a problem in that the charge buildup will disrupt the electric field within the column unit 1. Disruptions in the electrode field will reduce the degree of focus of the electrons, which will result, for example, in the blurring of the SEM image. This problem can be avoided easily in the lens column according to the present example embodiment.

Furthermore, because the inner column 11 is structured from a single material in the lens column according to the present example embodiment, and because the electrodes are formed on the surface of the inner column 11, it becomes possible to position the electrodes easily and with high precision.

Because the interconnections 4 are provided between the inner column 11 and the outer column 12 in the lens column according to the present invention, it is possible to reduce the size of the lens column, when compared to a case where the interconnections are provided on the outside of the lens unit 1.

Because the electrodes that have identical electric potentials are connected in the lens column according to the present invention, it is possible to reduce the number of connection points on the outside of the lens column 1. For example, in the gun lens 21, the electrode 211 and the electrode 213, which have identical electric potentials, have shared interconnections. If each of the electrodes were connected with outside interconnections independently, then there would be a total of three connections. In contrast, this can be reduced to two connections in the present example embodiment. Similarly, the provision of the interconnections 4 makes it possible to reduce the number of connections with outside interconnections in the astigmatism corrector 22, the XY deflector 23, and the object lens 24. This makes it possible to simplify the operations for attaching the lens column to a scanning electron microscope or to an electron beam device.

Figure 13:
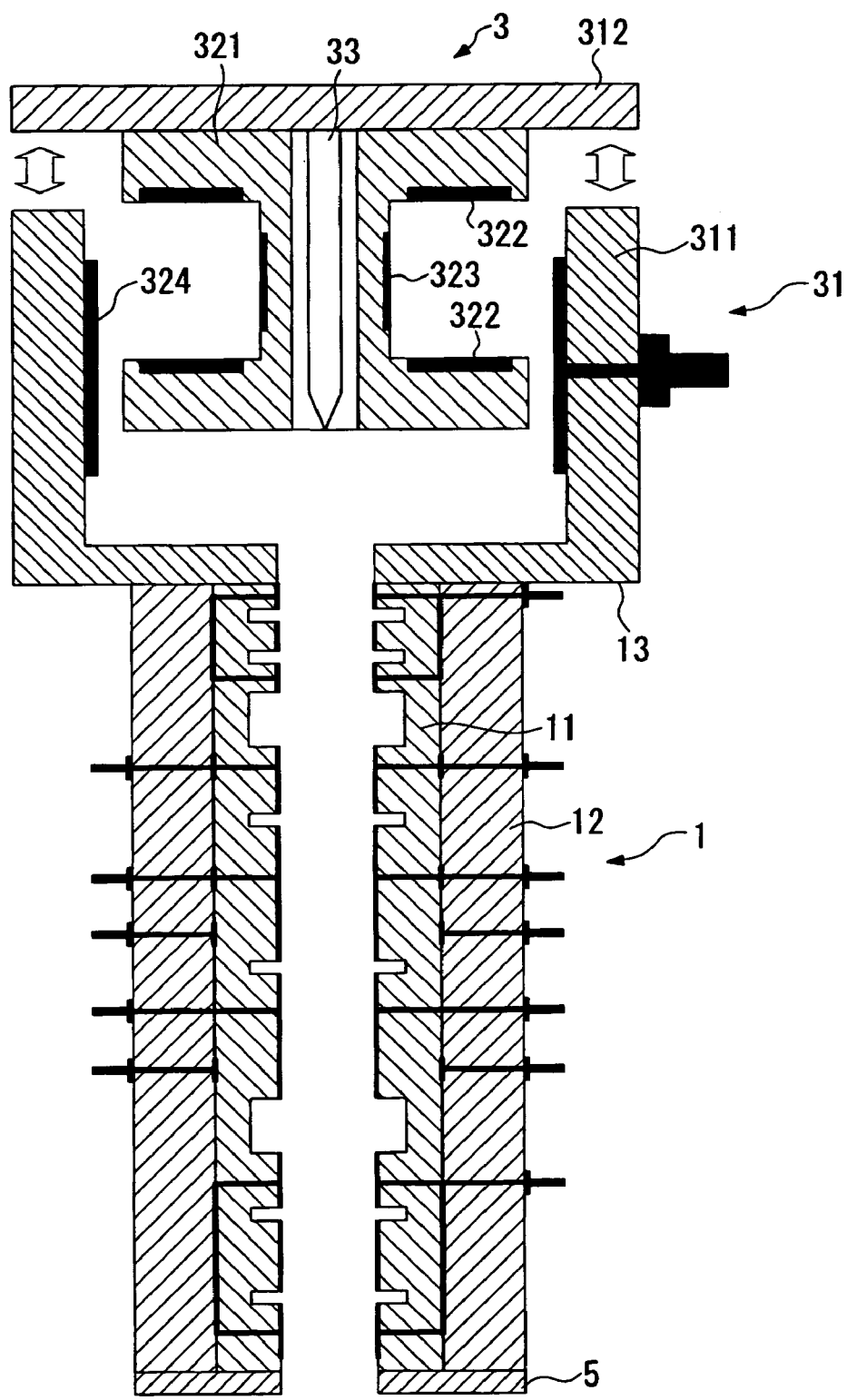
FIG. 13 is an explanatory diagram for the lengthwise cross section of a lens column according to a second example embodiment of the present invention.

A lens column according to a second example embodiment of the present invention will be explained next, based on FIG. 13. In this example embodiment, a vacuum chamber 31 of the electron gun chamber 3 has a column part 311 and a cover part 312. The column part 311 has a structure that is integrated with the flange 13 of the column unit 1. The electron gun cathode 33 and yoke 321 attach to the inner surface of the cover part 312. The anode 324 is attached to the inner surface of the column part 311. The balance of the structure is identical to that which has already been described for the first example embodiment, and is assigned the same numbering, and so further explanations are omitted.

Because the column part 311 that structures the vacuum chamber 31 is integrated with the column unit 1 in the lens column in the second example embodiment, it is possible to have excellent precision in the positioning of the electron gun chamber 3 and of the column unit 1.

A lens column according to a third example embodiment of the present invention will be explained next. In this example embodiment, all of the electrodes are divided into eight parts by the axial direction grooves 1112, the same way as in the examples of FIG. 4 and FIG. 5. In this case, as with the gun lens 21 and the object lens 24, each of the electrode parts in the rotationally symmetric electrodes is mutually connected via the interconnections 4.

Because the grooves 1112 are formed for all of the electrodes in the third example embodiment, it is possible to form the grooves 1112 along the inner surface of the inner column 11 all at once, with the benefit of being able to simplify the manufacturing operations. Other structures and benefits are the same as for the first example embodiment, described above, and thus detailed explanations are omitted.

Figure 14:
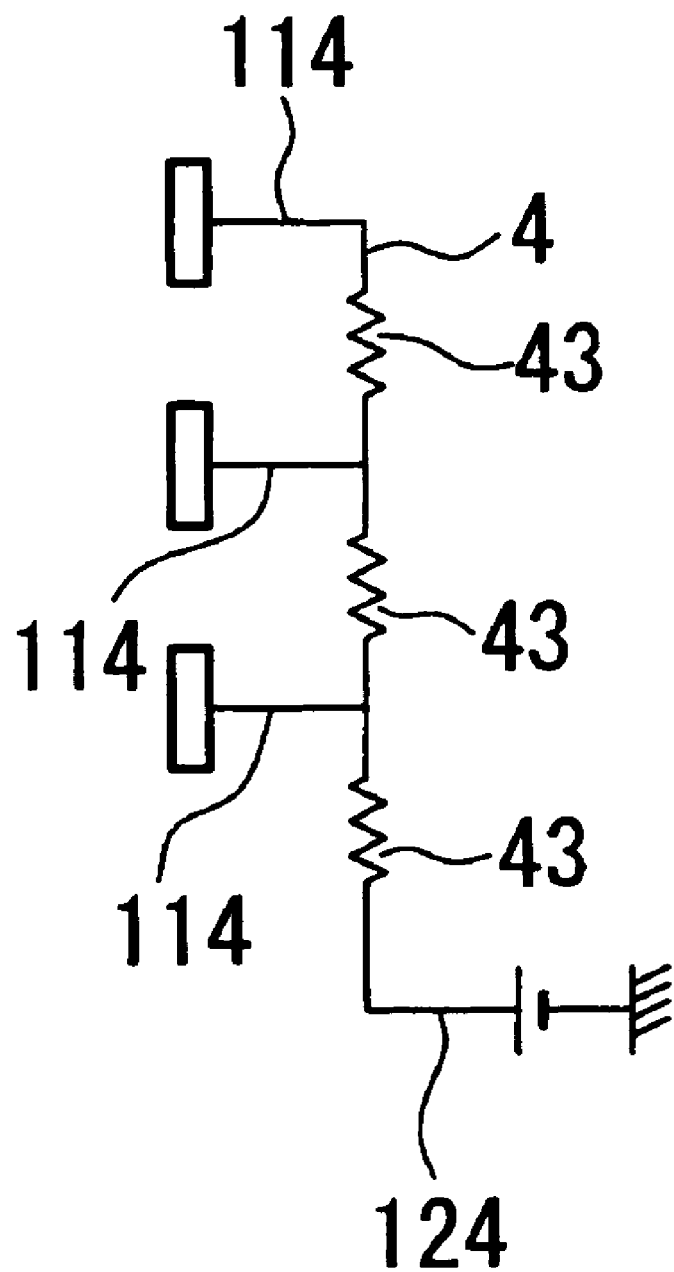
FIG. 14 is a schematic explanatory diagram for explaining the interconnections structure in a fourth example embodiment of the present invention.

A lens column according to a fourth example embodiment of the present invention will be explained next, based on FIG. 14. Note that FIG. 14 is for explaining the interconnections only, and so is presented schematically. In this lens column, resistances 43 are inserted in series in the interconnections 4, making it possible to apply different voltages to the various electrodes or electrode parts while still sharing the interconnections 4. Additionally, transistors or other switching elements can be used instead of the resistances 43. In such a case, it is possible to make complicated settings for the voltages applied.

Note that the aforementioned descriptions of example embodiments are no more than mere examples, and do not indicate structures required in the present invention. The structures of the various parts are not limited to the above, insofar as they can fulfill the intent of the invention.

For example, in the various example embodiments described above, the lens columns 1, as a whole, are structured from high-resistance electrically conductive ceramics. However, conversely, a structure may be used where only the inner surfaces of the lens columns 1 are structured from this composition. Furthermore, it is possible to have only the regions of the electrodes or the electrode parts be made from this composition.

In addition, when the electrodes or electrode parts are formed, they can be applied with the specific pattern from the start, using, for example, a printing method.

Moreover, in these example embodiments, the lens columns used two-layer structures; however, the present invention is not limited thereto, but, for example, multilayer structures of three or more layers may be used instead.

In addition, in these example embodiments, the inner column 11 and outer column 12 were fitted together through a heated fitting process or a chilled fitting process after firing the ceramics. However, said columns may be fitted together prior to firing, after high-pressure molding of the ceramic instead, with both columns fired together in this state. The inner column and outer column may be fitted together through this method instead.

POTENTIAL FOR USE IN INDUSTRY

The present invention makes it possible to provide an electron objects lens column suitable for miniaturization, and to provide a manufacture method thereof.

The invention claimed is:

1. An electron optical lens column characterized by comprising a column unit and an electrostatic lens disposed inside of said column unit and an inner surface of said column unit having a high-resistance electrical conductivity, that said column unit has an inner column and an outer column, said inner column is disposed on an inside of said outer column, and said electrostatic lens comprises electrodes used to produce an electric field within said column unit, said electrodes are connected to electrical interconnections for apply voltages to said electrodes, and said interconnections are disposed between said inner column and said outer column.

2. The electron optical lens column according to claim 1, characterized in the inner surface of said column unit is formed from a ceramic having high-resistance electrical conductivity.

3. The electron optical lens column according to claim 1, characterized in that said column unit is formed from, essentially, a single material.

4. The electron optical lens column according to claim 3, characterized in that said single material is a ceramic that has high-resistance electrical conductivity.

5. The electron optical lens column according to claim 1, characterized by said high-resistance electrical conductivity has a resistivity in the range of $10^8$ to $10^{10}$ Ω-cm.

6. The electron optical lens column according to claim 1 comprises a plurality of said electrodes and is further characterized by said electrodes with identical electric potentials being mutually connected via said electrical interconnections.

7. The electron optical lens column according to claim 1 comprises a plurality of said electrodes and is further characterized by said electrical interconnections connect together via one of resistances and switching element electrodes that have different electric potentials.

8. The electron optical lens column according to claim 1, characterized by said electrostatic lens comprising electrodes for generating electric fields on the inside of said column unit, and that said electrodes are attached to the inner surface of said column unit.

9. The electron optical lens column according to claim 1 further comprises a plurality of said electrostatic lenses, and is further characterized by electrodes for each electrostatic lens comprise multiple electrode parts that are mutually separate, and that the number of electrode parts in each of said electrodes is identical.

10. The electron optical lens column according to claim 1 further comprises a plurality of said electrostatic lenses, and is further characterized by each of said electrostatic lenses comprises electrodes, that said electrodes comprise multiple electrode parts that are mutually separate, and those electrode parts that have identical electric potentials are connected together electrically via common electrical interconnections.

11. The electron optical lens column according to claim 1, comprising a plurality of said electrostatic lenses, and further characterized by grooves formed between said electrostatic lenses.

12. The electron optical lens column according to claim 1, characterized said electrostatic lens comprises a plurality of electrodes, and that grooves are formed between said electrodes.

13. The electron optical lens column according to claim 1, characterized said electrostatic lens comprises an electrode, that said electrode comprises multiple electrode parts, and that grooves are formed between said electrode parts.

14. The electron optical lens column according to claim 1, characterized by an electron gun chamber is provided at one end of said column unit.

15. The electron optical lens column according to claim 14, characterized by a secondary electron detector is provided on another end of said column unit.

16. The electron optical lens column according to claim 1, characterized by a flange for attaching an electron gun chamber is provided on one end of said column unit, and integrated with said column unit.

17. The electron optical lens column according to claim 16, characterized by a sidewall of an electron gun chamber on one end of said column unit is provided integrated with said column unit.

18. A scanning electron microscope comprising a lens column according to claim 1.

19. An ion beam device comprising a lens column according to claim 1.

20. An electron optical lens column characterized by comprising a column unit and an electrostatic lens disposed inside of said column unit and an inner surface of said column unit is given high-resistance electrical conductivity, said column unit has an inner column and an outer column, said inner column is disposed inside said outer column, said column unit comprises a plurality of said electrostatic lenses, said electrostatic lenses comprise electrodes for generating electric fields on the inside of said column unit, said electrodes are attached to the inner surface of said column unit, said electrodes are equipped with a plurality of electrode parts that are mutually separate, said electrode parts that have identical electric potentials are mutually connected electrically via interconnections, and that said electrical interconnection are disposed between said inner column and said outer column, the high-resistance electrical conductivity is within a range of $10^8$ to $10^{10}$ Ω-cm.

21. An electron optical lens column characterized by comprising a column unit and an electrostatic lens disposed inside of said column unit and an inner surface of said column unit is given high resistance electrical conductivity, said column unit has an inner column and an outer column, said inner column is disposed inside said outer column, said column unit comprises a plurality of said electrostatic lenses, said electrostatic lenses comprise electrodes for generating electric fields on the inside of said column unit, said electrodes are attached to the inner surface of said column unit, said electrodes are equipped with a plurality of electrode parts that are mutually separate, said electrode parts are connected together via interconnections and resistances in order to apply differing voltages to electrode parts, and said interconnections and resistances are disposed between said inner column and said outer column.

22. An electron optical lens column characterized by comprising a column unit and an electrostatic lens disposed inside of said column unit and an inner surface of said column unit is given high residence electrical conductivity, said column unit comprises a plurality of said electrostatic lenses, said electrostatic lenses comprise electrodes for generating electric fields on the inside of said column unit, said electrodes are attached to the inner surface of said column unit, said electrodes are equipped with a plurality of electrode parts that are mutually separate, said electrode parts are connected together via interconnections and switching elements in order to apply differing voltages to these electrode parts, and said interconnections and switching elements are disposed between said inner column and said outer column.

23. A manufacturing method for an electron optical lens column comprising the following steps:
  (1) a step that coats an electrically conductive material on the inner surface of a column unit, and
  (2) a step that forms one set of electrodes for structuring an electrostatic lens through a removal of a portion of the aforementioned electrically conductive material that has been coated on the inner surface of the column unit.

24. A manufacturing method for an electron optical lens column comprising the following steps:
  (1) a step that coats an electrically conductive material on an inner surface of a column unit,
  (2) a step that obtains multiple electrodes for structuring one or more electrostatic lenses through of a removal of a potion of the aforementioned electrically conductive material that has been coated, and
  (3) a step that connects, via interconnections, those aforementioned multiple electrodes that have identical electric potentials.

25. A manufacturing method for an electron optical lens column comprising the following steps:
  (1) a step that coats an electrically conductive material on an inner surface of a column unit,
  (2) a step that obtains multiple electrode parts for structuring electrodes for electrostatic lenses through removing a portion of the aforementioned electrically conductive material that has been coated, and
  (3) a step that connects, via interconnections, those aforementioned multiple electrode parts that have identical electric potentials.

* * * * *